(12) United States Patent
Johnson et al.

(10) Patent No.: US 6,507,234 B1
(45) Date of Patent: Jan. 14, 2003

(54) ACTIVE TIMING ARBITRATION IN SUPERCONDUCTOR DIGITAL CIRCUITS

(75) Inventors: Mark W. Johnson, La Canada Flintridge, CA (US); Quentin P. Herr, Torrance, CA (US); Bruce J. Dalrymple, Redondo Beach, CA (US); Arnold H. Silver, Rancho Palos Verdes, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/711,321

(22) Filed: Nov. 13, 2000

(51) Int. Cl.[7] .................................................. H03K 3/38
(52) U.S. Cl. ........................ 327/528; 327/186; 327/367
(58) Field of Search ........................ 327/186, 366–371, 327/527–529; 326/1–7

(56) References Cited

U.S. PATENT DOCUMENTS 5,455,519 A * 10/1995 Ohori ........................ 327/367

FOREIGN PATENT DOCUMENTS

EP  527557 A1 * 2/1993

OTHER PUBLICATIONS

K. K. Likharev and V. K. Semenov, "RSFQ Logic/Memory Family: A New Josephson–Junction Technology for Sub–Terahertz–Clock–Frequency Digital Systems", IEEE Transactions on Applied Superconductivity, vol. 1, No. 1, Mar. 1991.

R.T. "Tets" Maniwa, "Global Distribution: Clocks and Power", http://www.isdmag.com/editorial/1995/coverstory9508.html, Aug., 1995.

* cited by examiner

*Primary Examiner*—Kenneth B. Wells
(74) *Attorney, Agent, or Firm*—Harness, Dickey & Pierce, P.L.C.

(57) ABSTRACT

A superconductor circuit (50) for providing active timing arbitration between SFQ pulses. The superconductor circuit (50) includes a first superconducting transmission line (52) having at least one inductor (54) for transmitting first input pulses, and a second superconducting transmission line (62) having at least one inductor (64) for transmitting second input pulses that are correlated to the first input pulses. The first and second superconducting transmission lines (52, 62) are coupled together in order to generate a flux attraction between the first and second input pulses for reducing relative timing uncertainty.

8 Claims, 4 Drawing Sheets

ACTIVE TIMING ARBITRATION IN SUPERCONDUCTOR DIGITAL CIRCUITS

CROSS REFERENCE TO RELATED PATENT APPLICATIONS

This application is related to U.S. patent application Ser. No. 09/711,322, filed on Nov. 13, 2000, entitled "Asynchronous Superconductor Serial Multiply-Accumulator" which is assigned to the same assignee as the present invention and which is herein incorporated by reference.

BACKGROUND OF THE INVENTION

1. Field of the Invention

This invention relates generally to a superconducting digital circuit, and more particularly, to a superconducting digital circuit that employs coupled Josephson superconducting transmission lines to provide active timing arbitration of data and clock signals.

2. Discussion of the Related Art

As is well understood in the art, superconducting single flux quantum (SFQ) digital circuits operate through the transmission and processing of very short duration, very small voltage pulses. See, for example, K. K. Likharev, V. K. Semenov; "RSFQ Log/Memory Family: A New Josephson-Junction Technology for Sub-Terahertz-Clock-Frequency Digital System"; IEEE Transactions on Applied Superconductivity, Vol. 1, No. 1, March 1991. These pulses are used to carry information to and between logic gates that are used to make up a larger digital circuit. These pulses carry both timing information, as when they used to transmit a clock signal, as well as data to be processed by some portion of the circuit. Digital circuits that employ superconductor devices, and in particular those based on transmission of single flux quanta, are often desirable because they can be operated at clock speeds exceeding 100 GHz.

Josephson junction transmission lines are typically employed in superconductor digital circuits to transmit narrow pulse width signals at low power. Josephson junction transmission lines employ Josephson junctions at predetermined intervals along the transmission line that regenerate and transmit pulse signals as single flux quanta (SFQ). A Josephson junction is a tunneling device that includes two opposing superconductive films, for example, Nb films, that are separated by an insulating dielectric layer. If a sufficient current bias is applied to each junction, then a voltage pulse applied across any junction will cause that junction to switch in such a way that it generates a voltage pulse, or regenerates the voltage pulse which caused it to switch. The time integral of the voltage pulse generated by junction switching in this way is determined by fundamental physical constants and is $h/2e$, where h is Plank's constant ($6.6262 \times 10^{-34}$ Joule seconds), and e is the fundamental electrical charge ($1.602 \times 10^{-19}$ Coulombs). The regenerated voltage pulse causes the next neighboring junction in the Josephson transmission line to switch in turn. In this way a voltage pulse can propagate along a Josephson transmission line. These pulses are referred to as single flux quanta pulses or SFQ pulses. A typical SFQ pulse is 2–3 ps in duration and 1 mV in amplitude.

FIG. 1 is a schematic view of a superconducting Josephson junction transmission line 10 that is representative of the known transmission lines of this type, and can be a clock transmission line or a data transmission line. The transmission line 10 propagates signal pulses as quantized magnetic flux, represented here as an SFQ pulse 12. The transmission line 10 includes a series of Josephson junction circuits 14, spaced at predetermined intervals along the transmission line 10, that act to regenerate the SFQ pulse 12 at each stage. The Josephson junction circuits 14 are connected in parallel between a reference ground and a power source 16. The power source 16 applies a current to the Josephson junction circuits 14. Each Josephson junction circuit 14 is represented as an ideal Josephson junction 18 in parallel with a shunting resistor 20 and an inductor 22. Inductors 26 are connected in series between each Josephson junction circuit 14 to allow propagation of the SFQ pulse 12 from one junction to the next.

Each time the added energy from the SFQ pulse 12 arrives at a Josephson junction circuit 14, the Josephson junction 18 switches, generating a voltage pulse that develops an SFQ pulse. That SFQ pulse then energizes the next Josephson junction 18, which also generates an SFQ pulse 12. Therefore, a pulse is recreated and propagates down the transmission line 10 in this manner as a particular clock or data pulse in the overall digital circuit. The spacing between the junction circuits 14 is application specific for a particular pulse width and power requirement.

Certain factors, such as thermal noise, Johnson noise in the various resistors, and component fabrication variations, affect how fast each junction 18 will generate the voltage pulse, and recreate the SFQ pulse sent to the next junction circuit 14. These effects provide an uncertainty as to when a clock or data pulse will reach a particular digital component in the circuit. This uncertainty in timing increases relative to the number of Josephson junctions in the particular transmission line as the square root of the number of junctions.

When operated at very high clock frequencies, timing between clock pulses and data pulses is critical, For example, in a digital circuit is operated at a 100 GHz clock, any given data pulse must arrive at its destination logic gate within a time interval of less than ten picoseconds in order to be correctly processed by that gate. Because of their high frequency, clock and data pulses arriving at any particular circuit element must be closely synchronized or errors will occur. The timing uncertainty of the SFQ pulses discussed above increases the need for greater timing synchronization. Therefore, superconductor circuits typically operate well below their potential speed so that the pulse timing uncertainty is less important.

Various techniques are known in the art for synchronizing data and clock pulses in superconductor digital circuits. For example, known superconductor digital circuits employ re-synchronizing elements and techniques that act to hold or store data pulses until they are re-synchronized to the clock signal. However, these procedures typically add complexity to the design of a particular circuit and are invasive and disruptive of the data signals, and reduce circuit speed.

What is needed is a superconductor digital circuit that employs active timing arbitration between clock and data pulses without suffering from the drawbacks discussed above. It is therefore an object of the present invention to provide active timing arbitration in a superconductive circuit.

SUMMARY OF THE INVENTION

The present invention solves the aforementioned problems by providing a superconductor digital logic circuit that reduces the relative timing uncertainty between signals propagating along two Josephson transmission lines by allowing active timing arbitration. The superconductor digital logic circuit includes a first superconducting transmission line having at least one inductor and at least one Josephson junction for transmitting a stream of first input SFQ pulses, and a second superconducting transmission line having at least one inductor and at least one Josephson junction for transmitting a stream of second input SFQ pulses that are correlated to the first input pulses. The first and second superconducting transmission lines are coupled together to provide a flux attraction and/or repulsion between the first and second input pulses for reducing relative timing uncertainty.

Additional objects, advantages, and features of the present invention will become apparent from the following description and appended claims, taken conjunction with the accompanying drawings.

DETAILED DESCRIPTION THE PREFERRED EMBODIMENTS

The present invention is directed to a superconductor digital circuit. More specifically, a superconductor digital circuit having a first transmission line for transmitting a first input signal and a second transmission line for transmitting a second input signal, where the second output signal is correlated with the first input signal. The second transmission line is coupled to the first transmission line for generating a flux attraction between the first and second input signals in order to reduce the relative timing uncertainly between the first and second input signals.

Figure 1:
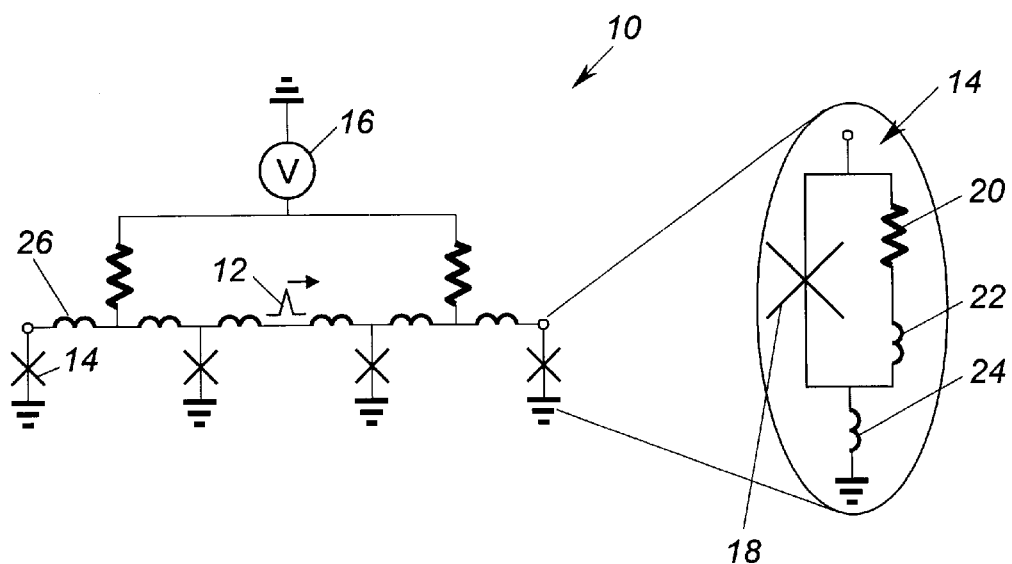
FIG. 1 is a schematic diagram of a known superconductor Josephson transmission line.
Figure 2:
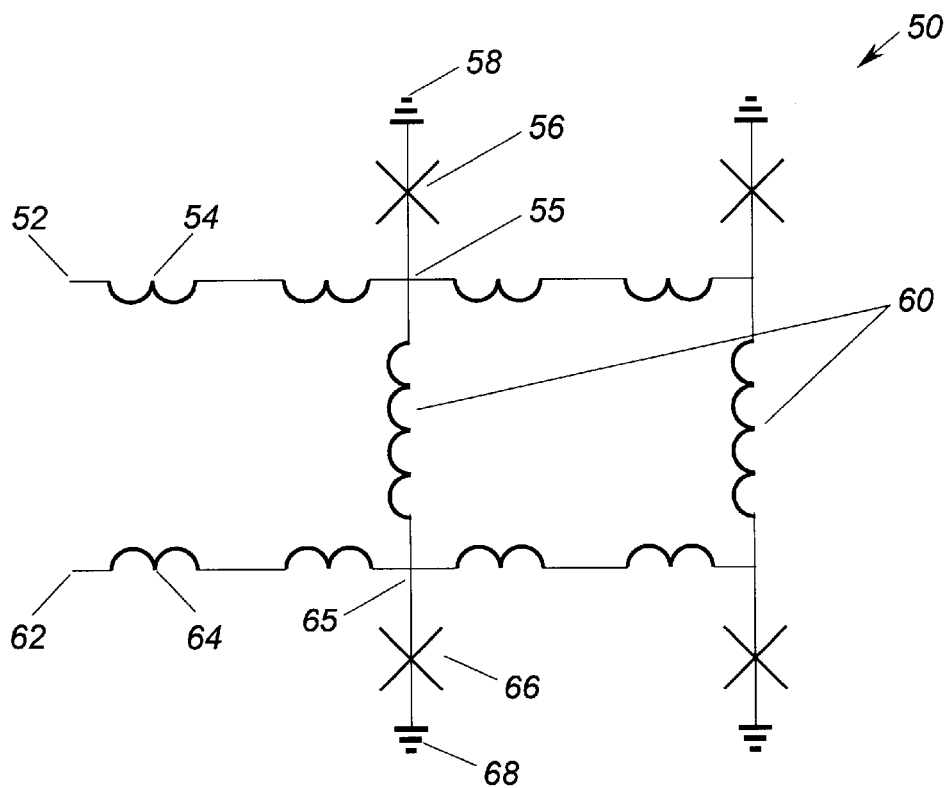
FIG. 2 is a schematic diagram of a superconductor circuit including two Josephson junction transmission lines that are inductively coupled to provide synchronization between nearly simultaneous pulses on the transmission lines, according to one embodiment of the present invention.

FIG. 2 is a schematic diagram of a superconductor digital circuit 50, according to the present invention, that synchronizes two nearly simultaneous single flux quantum (SFQ) pulses propagating along-first and second Josephson transmission lines (JTL) 52 and 62. The first JTL 52 includes a plurality of Josephson junctions 56 connected in parallel and a plurality of inductors 54 connected in series. The locations where the Josephson junctions 56 are connected to the inductors 54 define first nodes 55. Likewise, the second JTL 62 includes a plurality of Josephson junctions 66 connected in parallel and a plurality of inductors 64 connected in series. The locations where the Josephson junctions 66 are connected to the inductors 64 define second nodes 65. The opposite ends of the Josephson junctions 56 and 66 from the first and second nodes 55 and 65 are connected to respective grounds 58 and 68.

An inductor is connected to the first nodes 55 and the second nodes 65 to couple the JTLs 52 and 62 together. The inductors 60 correlate the SFQ pulses propagating on the first and second JTLs 52 and 62. More specifically, the inductor 60 resynchronizes the SFQ pulses at various places along the JTLs 52 and 62. An SFQ pulse is generated by the Josephson junction 56 when it receives an SFQ pulse from a previous junction. The SFQ pulse generated at junction 56 results in a current pulse through inductor 60 between nodes 55 and 65. This current pulse adds to the current bias applied to junction 66. If the SFQ pulse traveling along JTL 62 is lagging behind the one traveling along JTL 52, it will be accelerated by this current pulse when it reaches junction 66. This acceleration acts to reduce the time difference between the two SFQ pulses and resynchronize them. If the SFQ pulse traveling along JTL 62 is ahead of that in JTL 52, the situation is reversed and the pulse in JTL 52 is accelerated. The two SFQ pulses travel along the first and second JTLs 52 and 62, respectively, in a synchronized manner. This reduces the relative timing uncertainty, or the difference in time between the first and second SFQ pulses relative to each other. As shown, an inductor 60 is provided between each Josephson junction 66 and 66 in the JTLs 52 and 62 to reduce the relative timing and uncertainty between the first and second SFQ pulses at each interval or stage along the JTLs 52 and 62.

If the SFQ pulse on the second JTL 62 is lagging due to the difference in the amount of jitter present on the first and second JTLs 52 and 62, there would be an SFQ pulse at the first node 55 of the first JTL 52, but not at the second node 65 of the second JTL 52 at a given time. The voltage difference between the first and second JTLs 52 and 62 when the junction 56 forces the inductor 60 to draw current from the first node 55 and inject current into the second node 65. The extra current that is injected into the second node 65 accelerates the SFQ pulse on the JTL 62 that has not yet reached the second node 65. Further, the SFQ pulse that is traveling along the first JTL 52 is slowed as a result of the lost current. Therefore, the inductor 60 resynchronizes the first and second SFQ pulses, and reduces the relative timing uncertainty.

The direct coupling embodiment employing the inductors 60 is applicable only when there are nearly simultaneous SFQ pulses propagating along the JTL 52 and 62. Particularly, the direct coupling embodiment has particular use for reducing the clock skew of gates having two co-running JTLs that receive the identical clock pulse in a time synchronized manner. The direct coupling embodiment of the present invention reduces timing errors in a circuit by introducing flux attraction between two transmission lines carrying an identical signal. The direct coupling embodiment, thus, imposes the desired timing relationship between the two transmission lines and allows active timing arbitration thereof. The active timing arbitration allows the operating frequency of a sizable integrated circuit to approach the speed of the individual gates.

Figure 3:
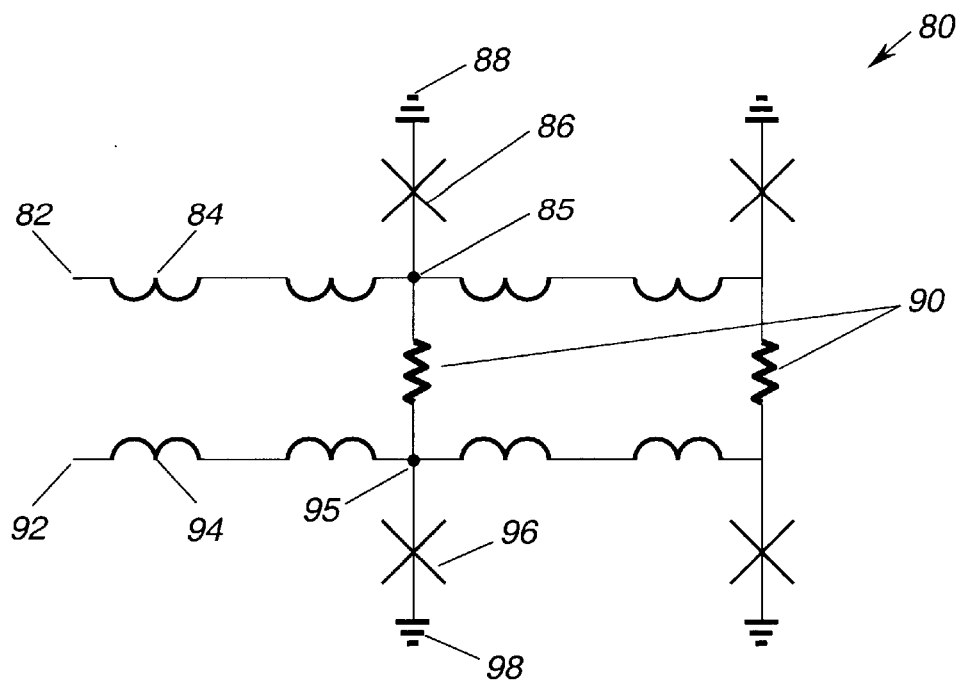
FIG. 3 is a schematic diagram of a superconductor circuit including two Josephson junction transmission lines that are resistively coupled together to provide synchronization between nearly simultaneous pulses on the transmission line, according to another embodiment of the present invention.

The concept of introducing flux attraction between two transmission lines can be expanded to a second embodiment of the present invention that uses resistive coupling instead of inductive coupling. FIG. 3 is a schematic diagram of a superconductor digital circuit 80 including a first JTL 82 and a second JTL 92 coupled together as will be discussed below. The first JTL 82 includes a plurality of inductors 84 connected in series, and a plurality of Josephson junctions 86 connected in parallel. Likewise, the JTL 92 includes a plurality of inductors 94 connected in series, and a plurality of Josephson junction 96 connected in parallel. A first node 85 is provided in each stage of the JTL 82 between the Josephson junction 86 and the corresponding inductor 84, as shown. Likewise, a second node 95 is provided between the Josephson junction 96 and the corresponding inductor 94 in the JTL 92. Each of the stages in the JTLs 82 and 92 includes a resistor 90 connecting the node 85 to the node 95, as shown, that couple the JTLs 82 and 92 together.

The resistors 90 couple the first and second JTLs 82 and 92 to correlate, or resynchronize, the first and second SFQ pulses at regular intervals along the JTLs 82 and 92. More specifically, the resistors 90 causes a flux attraction when SFQ pulses on the first and second JTLs 82 and 92 are close enough together in time within a predetermined range. When flux attraction occurs, current is drawn from the JTL with the faster SFQ pulse and injected into the other JTL that has lagging SFQ pulse through the resistor 90. By resynchronizing the first and second SFQ pulses in this manner, the relative timing uncertainty is reduced and active timing arbitration in a superconductor digital circuit is provided.

An important advantage of the circuit 80 is that resistive coupling is not limited to circuits having nearly simultaneous SFQ pulses, as was required with the circuit 50 above. Particularly, first SFQ pulses traveling on the first JTL 82 do not have to have counterpart SFQ pulses traveling on the second JTL 92. Thus, the coupling resistor 90 between the first and second JTLs 82 and 92 allows two different signals, for example a periodic SFQ clock signal and an SFQ data signal which is not periodic, to be correlated or time synchronized. As long as the two different SFQ pulses are nearly simultaneous, the resistor 90 synchronizes the two SFQ pulses in time as they travel along the first and second JTLs 82 and 92.

Figure 4:
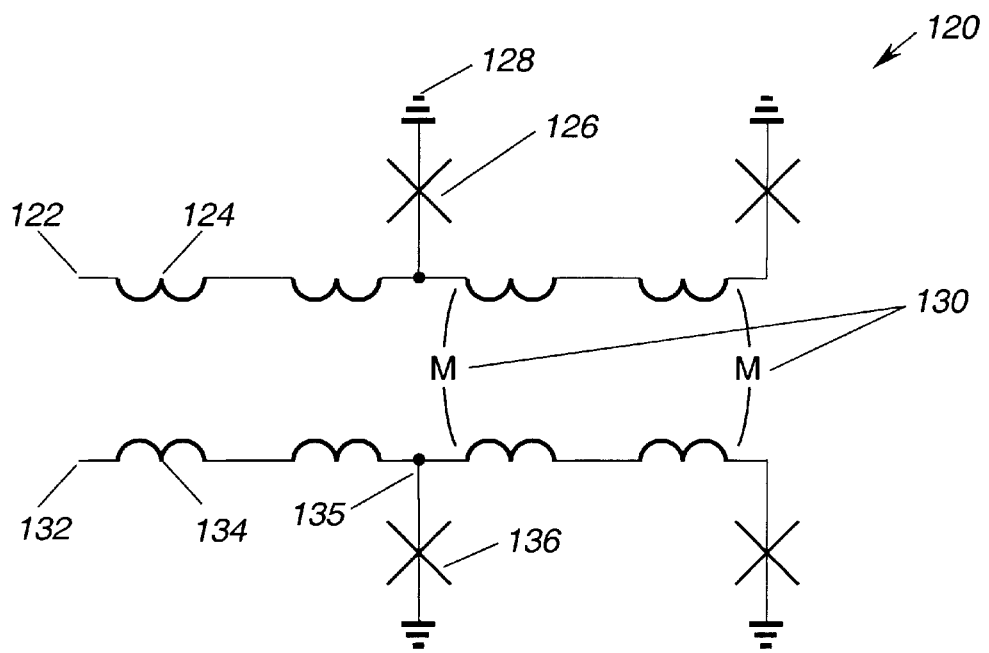
FIG. 4 is a schematic diagram of a superconductor circuit including two Josephson junction transmission lines that are magnetically coupled together to provide synchronization between nearly simultaneous pulses on the transmission lines, according to another embodiment of the present invention.

FIG. 4 is a schematic diagram of a superconductor digital circuit 120 that employs magnetic coupling between a first JTL 122 and a second JTL 132, according to another embodiment of the present invention. The magnetic coupling between the first and second JTLs 122 and 132 provides a flux attraction and/or repulsion between the two JTLs 122 and 132 to speed up or slow down the SFQ pulses in either transmission line to provide timing synchronization.

As above, the JTL 122 includes a plurality of inductors 124 connected in series, and a plurality of Josephson junctions 126 connected in parallel. The Josephson junctions 126 are connected to a first node 125 between corresponding inductor 124, as shown. Likewise, the JTL 132 includes a plurality of inductors 134 connected in series, and a plurality of Josephson junctions 136 connected in parallel, where respective junctions 136 are connected between corresponding inductors 134 at a second node 135.

The inductors 124 of the first JTL 122 are magnetically coupled with corresponding or aligned inductors 134 in the second JTL 132. The magnetically coupled inductors 124 and 134 cause magnetic flux attraction/repulsion when two SFQ pulses propagating along the first and second JTLs 122 and 132 are close enough together in time. This magnetic coupling reduces the relative timing uncertainty between the pulses, and allows active timing arbitration in the superconductor digital circuit 120. As with the resistive coupling circuit 80, the magnetic coupling circuit 120 is not limited to co-running JTLs with nearly simultaneous SFQ pulses. The magnetic coupling circuit 120 can be applied to circuits with different types of signals in JTLs 122 and 132, respectively, for example a clock and data signal, as described in the resistively coupled embodiment described above.

An important advantage of the circuit 120 is that the magnetic coupling may cause either flux attraction or flux repulsion between two SFQ pulses depending on the sign or orientation of the magnetic coupling relative to the direction of SFQ pulse propagation. More particularly, the SFQ pulses traveling along the first JTL 122 and the second JTL 132 may be synchronized by magnetically coupling the two JTLs 122 and 132, or the two SFQ pulses may be unsynchronized, or pushed farther away from each other, by changing the sign or orientation of the magnetic coupling relative to the direction of SFQ pulse propagation.

When the inductors 124 and 134 are coupled such that a current in the direction of SFQ pulse propagation in inductors 124 induces current against the direction of pulse propagation in inductors 134, this will be referred to as positive coupling. When the inductors 124 and 134 are coupled such that a current in the direction of SFQ pulse propagation in inductors 124 induces current in the direction of pulse propagation in inductors 134, this will be referred to as negative coupling. When there are nearly simultaneous SFQ pulses in JTLs 132 and 122, current from the JTL with a faster SFQ pulse induces a current in the JTL with the lagging SFQ pulse. For the case of positive magnetic coupling as described above, the current induced in the JTL with the lagging SFQ pulse acts to accelerate its SFQ pulse and resynchronize the two SFQ pulses, in a manner similar to that described in the inductive and resistive coupled embodiments above. For the case of negative magnetic coupling, the current induced in the second JTL acts to further increase the time difference between nearly simultaneous SFQ pulses in JTLs 122 and 132.

Figure 5:
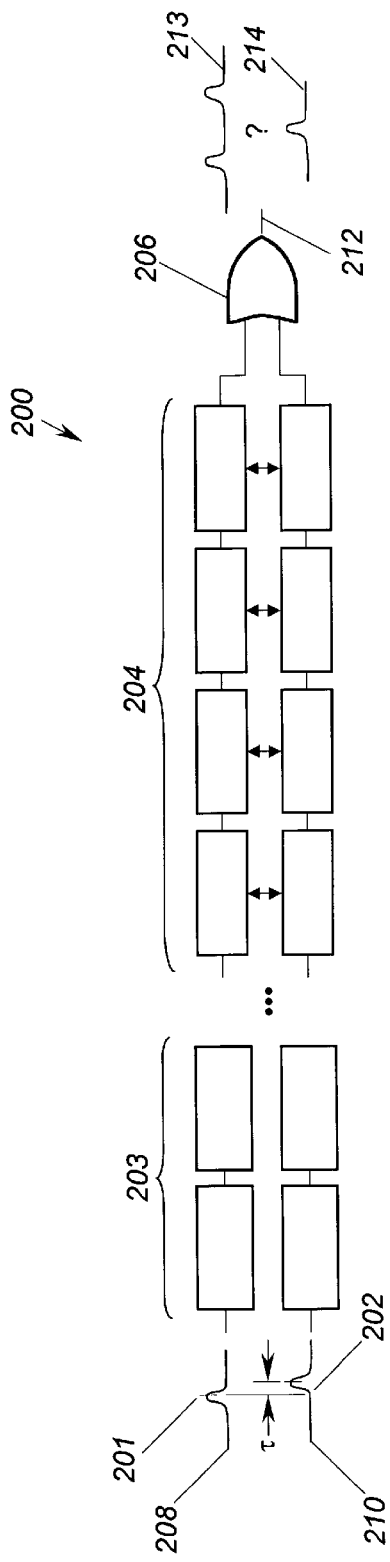
FIG. 5 is a block diagram illustrating the use of the magnetic coupling as described in the present invention to avoid pulse collisions in a confluence gate, shown in FIGS. 6A and 6B. This block diagram is the basis of simulations shown in FIG. 7.
Figure 6A:
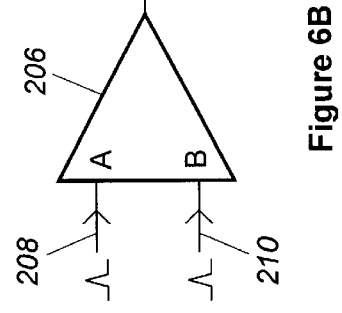
FIGS. 6A–6B show a confluence gate to illustrate the timing logic in the oscillator/multiply-accumulator analog-to-digital converter shown in FIG. 5.
Figure 6B:

The repulsive magnetic coupling embodiment has particular application for superconductor circuits having a clock signal and a data signal that must be some time period apart from each other to interact. An illustration of the use of repulsive magnetic coupling is the prevention of timing violations in an SFQ confluence gate as shown in FIG. 5. FIGS. 6A and 6B describe the basic conditions of a timing violation in the confluence gate 206. The confluence gate 206 shown in FIG. 6A will take an SFQ pulse at either one of its input ports 208 and 210 and reproduce it at its output port 212. In fact pulses 208 and 210 can arrive at both input ports of the confluence gate and will be transmitted to the output gate as long as they do not arrive within a certain time τ of each other, about five picoseconds. As shown in FIG. 6B, upon receiving input of nearly simultaneous pulses at both inputs 208 and 210, if those pulses arrive at the confluence gate within τ, or about five picoseconds of each other, only one of the two pulses 214 will be produced at the output. There are some applications for which losing a pulse in this manner is an error, and the condition which causes this error is a timing violation.

In the block diagram for circuit 200 shown in FIG. 5, nearly simultaneous SFQ pulses 201 and 202 arrive on transmission lines 208 and 210, respectively. The transmission lines 208 and 210 each include a series of uncoupled JTLs 203 and a series of coupled JTLs 204. The timing violation described above in connection with FIG. 6B can be avoided by incorporating the magnetically coupled JTLs 204 immediately before the confluence gate 206. If JTLs 204 are coupled with a negative sense as described above, such that any time separation between nearly simultaneous pulses tends to increase due to the coupling, the probability of a timing violation occurring is reduced.

Plot 226 illustrates the probability of a collision, or the probability that the two SFQ input pulses 201 and 202 coincide and result in timing violations when no coupled JTLs are incorporated in the circuit 200. The probability of a collision is almost one when the time difference, τ, between the two input pulses 201 and 202 is less than 4 picosecoonds (ps) of delay time. This implies that if none of the coupled JTLs are used, and τ is less than 4 ps, collision between the two input pulses 201 and 202 is guaranteed. The probability of a collision starts to decline when τ is longer than 5 ps, and the collision may be avoided when τ is longer than 6 ps. Thus, at least 6 ps of delay time between the two SFQ input pulses 201 and 202 is required for the circuit 200 to avoid any timing violation.

Plot 228 illustrates the probability of a collision between the two input pulses 201 and 202 when two coupled JTLs 204 are incorporated in the circuit 200. The probability of a collision starts to diminish when τ is about 1 ps, and the collision between the two input pulses 201 and 202 may be avoided when τ is longer than 2 ps.

Plot 230 illustrates the probability of a collision between the two input pulses 201 and 202 when four coupled JTLs 204 are used. The collision may be avoided when τ is longer than 1 ps. When eight coupled JTLs 204 are used in the multiply-accumulator, the collision maybe avoided even when τ is less than 1 ps as illustrated in plot 232.

Figure 7:
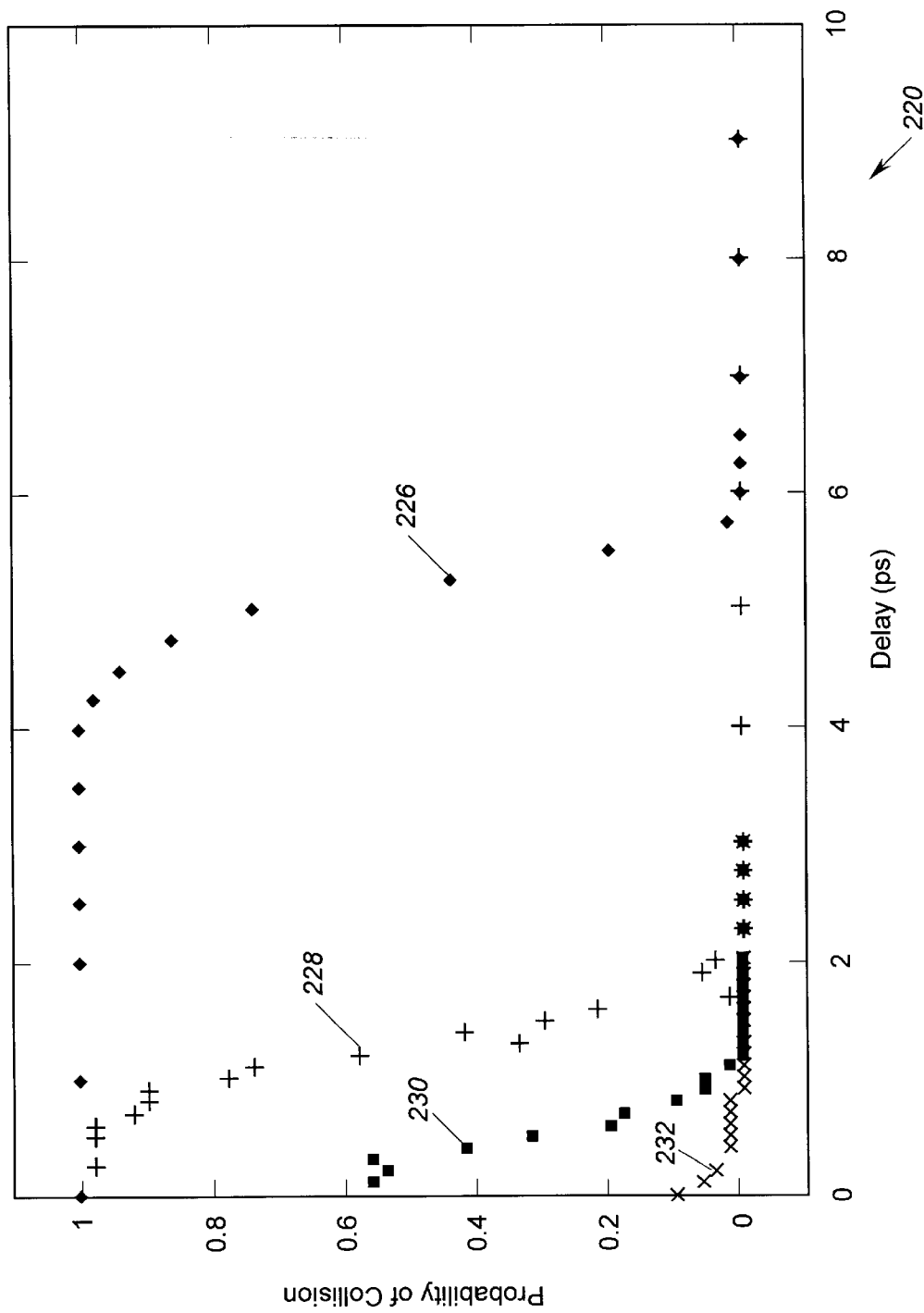
FIG. 7 is a graph showing illustrative simulation plots depicting the relationship between the probability of collision and the time delay for varying amount of magnetic coupling of two Josephson junction transmission lines, according to the present invention.

The simulation plots shown in FIG. 7 illustrate that the more coupled JTLs incorporated in the circuit 200 the less delay time between the input pulses 201 and 202 is required to avoid collisions between the two SFQ input pulses 201 and 202. It should be understood that the application of the coupled JTLs may vary depending on the timing requirements, types and sizes of circuits being used. It should also be understood that the three embodiments described above may be used in conjunction with each other depending on the circuit.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and following claims.

What is claimed is:

1. A superconductor circuit comprising:
    a first superconducting transmission line operable to transmit a first input signal, the first superconducting transmission line having at least one Josephson junction directly coupled thereto at a first node; and
    a second superconducting transmission line operable to transmit a second input signal that is correlated in time to the first input signal, the second superconducting transmission line having at least one Josephson junction directly coupled thereto at a second node, wherein the first node of the first superconducting transmission line is directly coupled by a resynchronizer to the second node of the second superconducting transmission line, the resynchronizer operable to generate a flux attraction between the first input signal and the second input signal, thereby reducing relative time uncertainty between the first and second input signals.

2. The superconductor circuit of claim 1 wherein the resynchronizer comprises an inductor directly coupled between the first node of the first superconducting transmission line and the second node of the second superconducting transmission line.

3. The superconductor circuit of claim 1 wherein the resynchronizer comprises a resistor directly coupled between the first node of the first superconducting transmission line and the second node of the second superconducting transmission line.

4. The superconductor circuit of claim 1 wherein at least one of the first and second superconducting transmission lines further comprises at least two inductors connected in series, such that the node connecting the at least one Josephson junction is disposed between the at least two inductors.

5. The superconductor circuit of claim 1 wherein at least one of the first input signal and second input signal comprises a stream of single flux quantum (SFQ) pulses.

6. A superconductor circuit comprising;
    a first superconducting transmission line operable to transmit a first input signal, the first superconducting transmission line having at least one Josephson junction directly coupled thereto at a first node; and
    a second superconducting transmission line operable to transmit a second input signal that is correlated in time to the first input signal, the second superconducting transmission line having at least one Josephson junction directly coupled thereto at a second node, wherein the first node of the first superconducting transmission line is directly coupled by an inductor to the second node of the second superconducting transmission line, thereby reducing relative time uncertainty between the first and second input signals.

7. The superconductor circuit of claim 6 wherein at least one of the first and second superconducting transmission lines further comprises at least two inductors connected in series, such that the node connecting the at least one Josephson junction is disposed between the at least two inductors.

8. A method for providing active timing arbitration in a superconducting digital circuit, comprising:
    transmitting a first input signal along a first superconducting transmission line, the first superconducting transmission line having at least one Josephson junction directly coupled thereto at a first node and the first input signal traversing through the first superconducting transmission line at a first transmission rate;
    transmitting a second input signal that is substantially correlated in time to the first input signal along a second superconducting transmission line, the second superconducting transmission line having at least one Josephson junction directly coupled thereto at a second node and the second input signal traversing through the second superconducting transmission line at a second transmission rate that varies from the first transmission rate; and
    reducing timing variance between the first input signal as it traverses through the first node and the second input signal as it traverses through the second node by directly coupling the first node of the first superconducting transmission line via an inductor to the second node of the second superconducting transmission line.

* * * * *